(12) United States Patent
Grasmueller

(10) Patent No.: US 6,480,223 B1
(45) Date of Patent: Nov. 12, 2002

(54) METHOD AND DEVICE FOR DETECTING THE POSITION OF TERMINALS AND/OR EDGE OF COMPONENTS

(75) Inventor: Hans-Horst Grasmueller, Mammendorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/176,361

(22) Filed: Oct. 21, 1998

Related U.S. Application Data

(63) Continuation-in-part of application No. 09/064,127, filed on Apr. 22, 1998, now abandoned.

(30) Foreign Application Priority Data

Sep. 30, 1997 (DE) .......................................... 197 43 352

(51) Int. Cl.$^7$ ................................................. H04N 7/18
(52) U.S. Cl. ........................... 348/87; 348/94; 382/151; 382/153; 356/400; 29/407
(58) Field of Search ...................... 348/87, 94; 382/153, 382/151; 356/400, 615, 375; 29/407, 720, 740

(56) References Cited

U.S. PATENT DOCUMENTS

| | | | | | |
|---|---|---|---|---|---|
| 4,281,342 A | * | 7/1981 | Ueda et al. | .................... | 348/94 |
| 4,628,464 A | * | 12/1986 | McConnell | ................... | 382/153 |
| 4,893,396 A | * | 1/1990 | Ainsworth et al. | ........... | 29/407 |
| 5,369,493 A | * | 11/1994 | Tomita et al. | .............. | 356/400 |
| 5,502,890 A | | 4/1996 | Günter | | |
| 5,519,495 A | * | 5/1996 | Kawaguchi | .................. | 356/615 |
| 5,724,722 A | * | 3/1998 | Hashimoto | .................... | 29/740 |
| 5,854,745 A | * | 12/1998 | Muraoka et al. | .............. | 348/87 |

FOREIGN PATENT DOCUMENTS

EP      0 320 317      6/1989

OTHER PUBLICATIONS

Patent Abstracts of Japan, Publication No. 01241680, Sep. 26, 1989, For Japanese Application 63070007.

* cited by examiner

*Primary Examiner*—Chris Kelley
*Assistant Examiner*—Shawn S. An
(74) *Attorney, Agent, or Firm*—Harness, Dickey & Pierce P.L.C.

(57) ABSTRACT

In a method and device for detecting the position of components, the relative position of terminals and/or edges of components relative to a transport device is obtained using a camera with an image evaluation unit connected downstream that obtains an image containing the terminals together with a position marking securely connected to the transport device. The position marking is itself located in the immediate vicinity of the terminals or is imaged at such a location via an optical imaging element. A more precise position detection is assured. A fast position detection is also realized given a moving transport device and a short exposure time for the imaging by the camera.

9 Claims, 2 Drawing Sheets

METHOD AND DEVICE FOR DETECTING THE POSITION OF TERMINALS AND/OR EDGE OF COMPONENTS

RELATED APPLICATION

The present application is a continuation-in-part of U.S. application Ser. No. 09/064,127, filed Apr. 22, 1998, now abandoned.

BACKGROUND OF THE INVENTION

FIELD OF THE INVENTION

The present invention relates to a method and device for detecting the position of terminals and/or edges of components, wherein an imaging camera is employed.

DESCRIPTION OF THE PRIOR ART

In the automatic insertion or assembly of printed boards or ceramic substrates with SMD components, the individual components are removed from a magazine or a delivery means using an insertion head and are then positioned in a prescribed position on the printed board or the ceramic substrate. Since the components have a positional tolerance of approximately 1 millimeter in the magazine or in the pick-up position of a delivery means, yet require highly exact positioning on the printed board or the ceramic substrate, an automatic position detection and correction is necessary. The position detection should require as little time as possible in order to enable a high insertion performance (throughput) of the insertion machine.

Known arrangements for detecting the position of the terminals and/or of the edges of components form images of the component or parts of the component, on a planar CCD camera via an objective and detect the position of the terminals of the component by means of digital image processing. The position of the component is subsequently corrected prior to placement with the aid of a transport device at which the component is secured at the insertion head. In practice the method is also designated as optical centering of the component.

PCT Application WO 93/19577 teaches a method for position detection wherein an immediate casting of shadows of the terminal region of a side of a component is created on the photosensitive surface of a spatially resolving opto-electronic transducer or converter (as a camera). The opto-electronic transducer is therein secured at the insertion head, and the position of the terminals is determined with reference to the opto-electronic transducer. The position of the terminals with reference to the insertion head is determined by a known relative position of the opto-electronic transducer relative to the insertion head. In his method, it is assumed that the position of the camera relative to the transport device is known exactly and that it can be approached exactly. Any errors due to a drift of the camera location or due to transient processes in the approaching of the camera position enter into the measurements as errors. Thus it is necessary to wait until the transport device has come to a halt.

Methods are also known in which a photographing or image pick-up of the component ensues with very short exposure time (flash operation) during a continuous motion of the transport device with the component. At the time of the imaging, the position of the transport device relative to the camera is determined by counting rotations of the axis of the transport device. Given errors between the count and the actual position of the transport device, the determination of the relative position between component and transport device in this method is also impeded.

SUMMARY OF THE INVENTION

It is an object of the present invention to provide a method and a device which guarantee a more precise and a faster detection of the position of components with reference to the transport device.

The above object is achieved in accordance with the principles of the present invention in a method and device for detecting the position of terminals and/or edges of components with reference to a transport device with which the components are detachably held wherein the transport device has at least one position marking fixedly connected thereto and wherein a camera obtains an image of the position marking, together with the terminals and/or edges of the component held by the transport device. An evaluation unit, supplied with the aforementioned image obtained by the camera, identifies the relative position between the terminals and/or the edges, and the position marking. The relative position between the terminals and/or the edges and the transport device can then be determined from the relative position identified from the image.

By a common imaging of position markings connected securely with the transport device and of the terminals and/or of the edges of the components, the relative position between the transport device and the terminals and/or the edges of the components is determined in the image evaluation unit without knowledge of the exact position of the camera, whereby a more exact detection of position is guaranteed. Transient processes have no influence on the precision, since they affect the position markings and the terminal and/or the edge in the same way.

In an embodiment of the method and device, the position markings are connected to the transport device such that they are arranged in the immediate vicinity of the terminals and/or the edges, so that they lie in a common depth-of-field region of the camera along with the terminals and/or the edges and are picked up with equal sharpness.

In a preferred embodiment of the method and device, the position markings are imaged by an optical imaging in the immediate vicinity of the terminals and/or the edges, so that the environment of the terminals and/or the edges is kept free of costly structures.

The imaging can ensue on a ground-glass screen in the immediate vicinity of the terminals and/or the edges, which simplifies the photographing or pick-up of the image by the camera.

A more rapid completion of the position detection of the components is achieved when the imaging ensues with short exposure time and thus also during the motion of the transport device.

DESCRIPTION OF THE PREFERRED EMBODIMENTS

Figure 1:
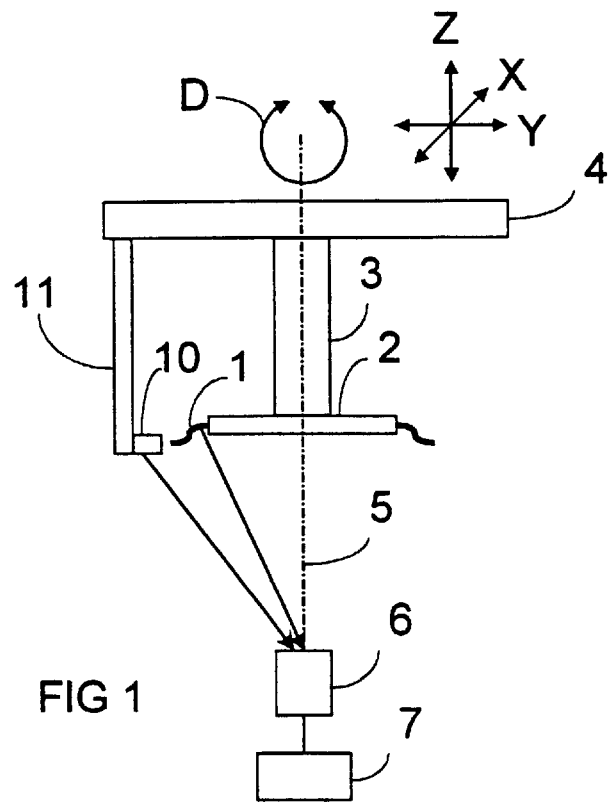
FIG. 1 is a schematic cross-section through a device for position detection constructed and operating in accordance with the invention, with position markings in the immediate vicinity of the terminals.

FIG. 1 depicts how the terminals 1 of a component 2 are used for position detection. The edges of the components 2 can also be used analogously to the terminals 1 for position detection. The component 2 is detachably secured to a transport device 4 of an insertion head (not shown) via a suction pipette 3, for example. For collection of the component 2 from delivery means (not shown) and for placement of the component 2 onto printed boards or ceramic substrates (not shown), the transport device can be moved translationally in at least three directions X, Y, Z, and an additional rotary motion D—about a center axis 5 of the suction pipette 3, for example—is provided for position correction of the component. A camera 6—with an image evaluation unit 7 connected downstream for a digital image evaluation—obtains an image containing the terminals together with at least one position marking 10 connected securely to the transport device 4 via a holder 11. The relative position between the position marking 10 and the transport device is thereby strictly defined and known. The position marking 10 is located in the same depth-of-field region of the camera 6 as the terminals 1, so that the position marking and the terminals 1 are imaged with equal sharpness. The relative position between the component 2 and the transport device 4 thus is directly determined in the image evaluation unit 7, and a correction of the motion of the transport device 4 is determined therefrom in order to obtain the correct insertion position of the component 2 on the printed board or the ceramic substrate.

Figure 2:
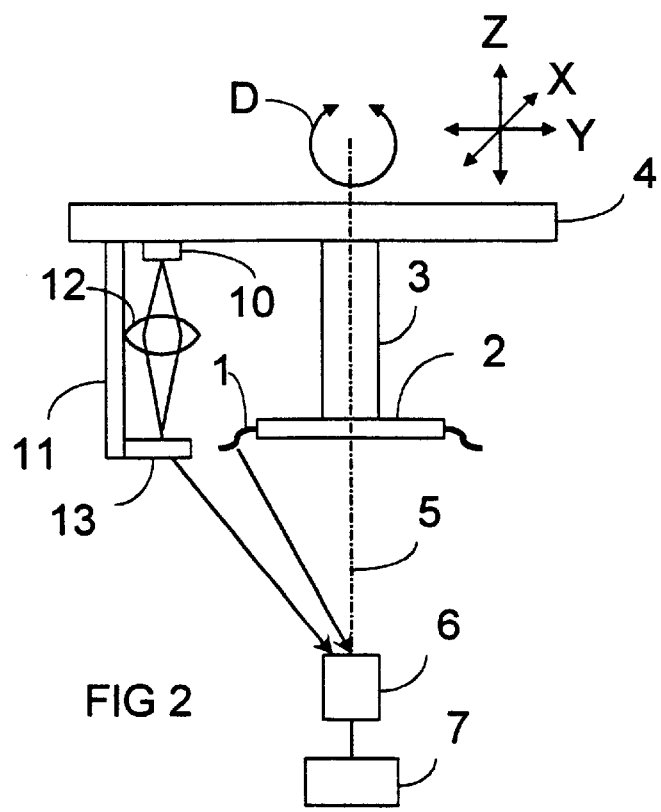
FIG. 2 is a schematic cross-section through a device for position detection constructed and operating in accordance with the invention, with imaging of the position markings on a ground-glass screen in the immediate vicinity of the terminals.

FIG. 2 depicts a device in an additional exemplary embodiment in which the position markings 10 are further removed from the terminals 1 compared to the previous embodiment, but they are imaged on a ground-glass screen 13 via an optical imaging element 12. The ground-glass screen 13 is arranged in the immediate vicinity of the terminals 1, so that they are located in the same depth-of-field region of the camera 6 as the terminals 1. The ground-glass screen 13 and the optical imaging element 12 are securely connected with the transport device 4 via the holder 11, so that displacements, which would lead to more imprecise position determination, do not arise between these components.

The ground-glass screen 13 can be forgone if the real image of the position marking is taken directly with the camera 6. This avoids complicated structures in the vicinity of the component 2 and the terminals 1, allowing even variably sized components 2 to be processed with a common position detection device.

Figure 3:
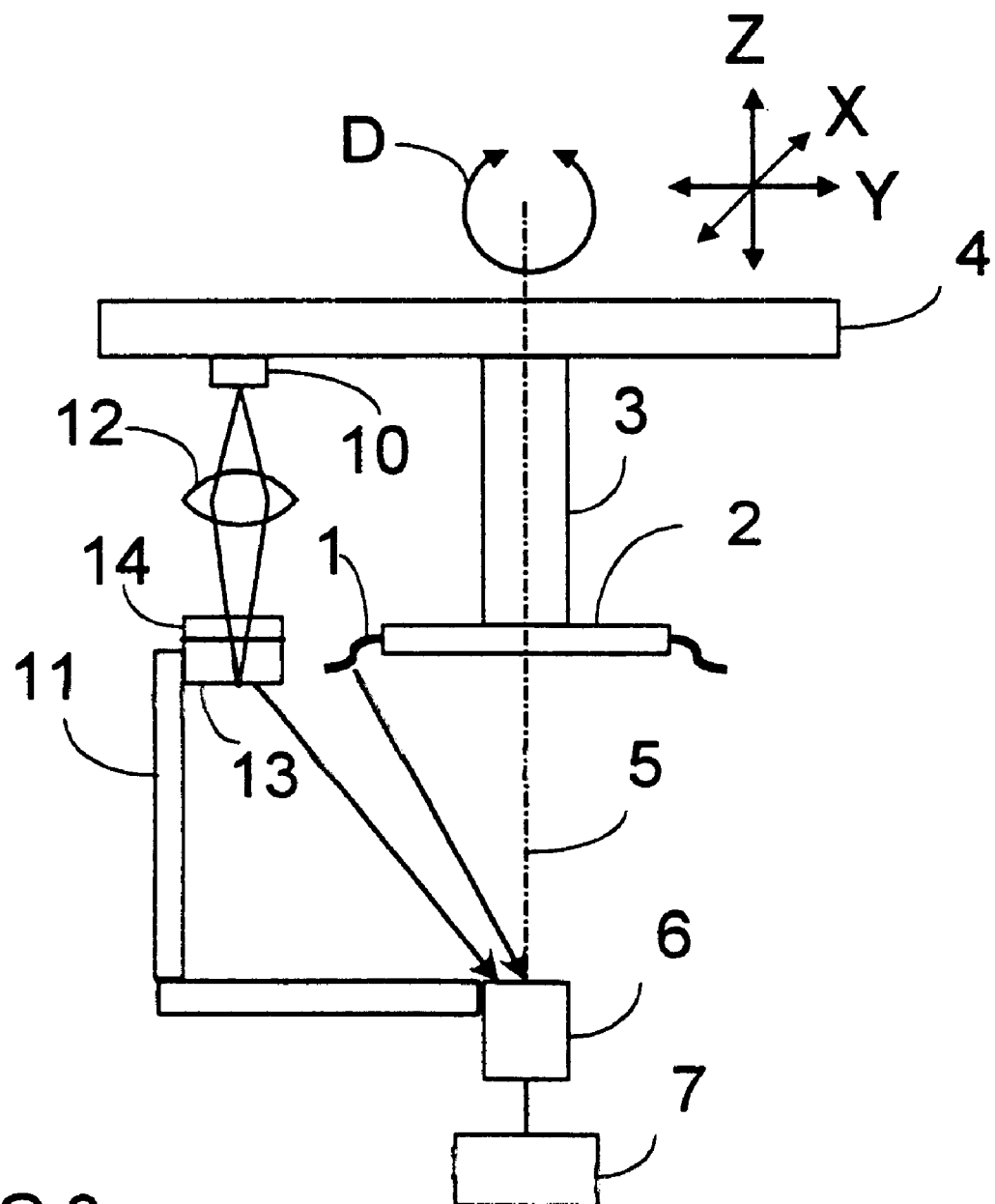
FIG. 3 is a schematic cross-section through a device for position detection constructed and operating in accordance with the invention, wherein an imaging of the position markings takes place on a ground-glass screen secured to the camera itself.

As shown in FIG. 3, the ground-glass screen 13 can be secured directly to the camera 6, such as being made a part of a field lens 14. The field lens 14 is at least one component of the aforementioned optical imaging element 12. By the implementation of the ground-glass screen as part of the field lens 14, more light is available for the generation of the image, and thus the image has a higher luminous intensity.

By the direct imaging of the position of the transport device 4 with the terminals 1 of the component 2, the relative position between the transport device 4 and the terminals 1 can be detected with short exposure time, even given a transport device which has been moved relative to the camera 6, which reduces the time for the position detection and increases the insertion performance (throughput).

Although modifications and changes may be suggested by those skilled in the art, it is the intention of the inventor to embody within the patent warranted hereon all changes and modifications as reasonably and properly come within the scope of his contribution to the art.

I claim as my invention:

1. An apparatus for detecting a position of at least one feature of an electrical component, selected from the group of features consisting of a component terminal and a component edge comprising:

a transport device which picks up a component and detachably holds said component on said transport device;

holder means for fixedly mounting at least one position marking to said transport device at a fixed location with respect to said transport device, in proximity to the component held by said transport device;

means for producing a real image of said at least one position marking at a location substantially adjacent said feature;

camera means for obtaining an image which contains both said real image of said at least one position marking, and said feature; and evaluation means for evaluating said image to identify a relative position between said feature and said at least one position marking, and from said relative position identifying a relative position between said feature and said transport device, wherein said means for producing a real image comprises means for projecting said real image of said at least one position marking onto a ground-glass screen disposed substantially adjacent to said feature, wherein said camera means has a field lens, and wherein said ground-glass screen comprises a part of said field lens.

2. An apparatus as claimed in claim 1 wherein said holder means comprises means for fixedly mounting said at least one position marking substantially adjacent said feature.

3. An apparatus as claimed in claim 1 wherein said ground-glass screen is mounted on said transport device.

4. An apparatus as claimed in claim 1 wherein said ground-glass screen is mounted on said camera.

5. An apparatus as claimed in claim 1 wherein said camera means comprises means for obtaining said image with a short exposure time while said transport device is moving.

6. An apparatus for detecting a position of at least a portion of an electrical component, comprising:

a transport device, adapted to pick up and detachably hold at least a portion of the electrical component, wherein at least one position marking is at a fixed location on said transport device, in proximity to the portion of the electrical component held by said transport device;

means for producing an image of the at least one position marking at a location substantially adjacent the portion of the electrical component and for obtaining an image including both said produced image of the at least one position marking, and the portion of the electrical component; and means for identifying a relative position between the portion of the electrical component and the at least one position marking, and for identifying a relative position between the portion of the electrical component and the transport device, from the identified first relative position, wherein said means for producing an image includes means for projecting said image of said at least one position marking onto a screen disposed substantially adjacent the portion of the electrical components, wherein said means for producing includes a camera including a field lens, and wherein the screen includes a ground-glass screen which is a part of the field lens.

7. An apparatus as claimed in claim 6, wherein the screen includes a ground-glass screen mounted on the transport device.

8. An apparatus as claimed in claim 6, wherein the screen includes a ground-glass screen mounted on a camera.

9. An apparatus as claimed in claim 6, wherein said means for producing includes a camera, the camera including means for obtaining the image with a short exposure time while said transport device is moving.

* * * * *